(12) United States Patent
Prajuckamol et al.

(10) Patent No.: US 12,300,558 B2
(45) Date of Patent: May 13, 2025

(54) SUBSTRATES AND RELATED METHODS

(71) Applicant: SEMICONDUCTOR COMPONENTS INDUSTRIES, LLC, Phoenix, AZ (US)

(72) Inventors: Atapol Prajuckamol, Thanyaburi (TH); Chee Hiong Chew, Seremban (MY); Yushuang Yao, Shenzhen (CN); Vemmond Jeng Hung Ng, Senawang (MY)

(73) Assignee: SEMICONDUCTOR COMPONENTS INDUSTRIES, LLC, Scottsdale, AZ (US)

( * ) Notice: Subject to any disclaimer, the term of this patent is extended or adjusted under 35 U.S.C. 154(b) by 92 days.

(21) Appl. No.: 18/160,450

(22) Filed: Jan. 27, 2023

(65) Prior Publication Data
US 2024/0258181 A1    Aug. 1, 2024

(51) Int. Cl.
| | |
|---|---|
| *B32B 3/10* | (2006.01) |
| *B32B 3/02* | (2006.01) |
| *B32B 9/00* | (2006.01) |
| *B32B 9/04* | (2006.01) |
| *B32B 15/20* | (2006.01) |
| *H01L 21/48* | (2006.01) |
| *H01L 23/13* | (2006.01) |
| *H01L 23/373* | (2006.01) |

(52) U.S. Cl.
CPC ........... *H01L 23/13* (2013.01); *B32B 3/02* (2013.01); *B32B 9/005* (2013.01); *B32B 9/041* (2013.01); *B32B 15/20* (2013.01); *H01L 21/4871* (2013.01); *H01L 23/3735* (2013.01); *B32B 2250/03* (2013.01); *B32B 2250/40* (2013.01); *B32B 2307/206* (2013.01); *B32B 2457/00* (2013.01)

(58) Field of Classification Search
None
See application file for complete search history.

(56) References Cited

U.S. PATENT DOCUMENTS

| | | | | |
|---|---|---|---|---|
| 5,098,494 A | * | 3/1992 | Reisman | ............... C04B 37/005 428/210 |
| 6,426,154 B1 | * | 7/2002 | Naba | ....................... H01L 23/13 428/629 |
| 2014/0291699 A1 | | 10/2014 | Yano et al. | |

FOREIGN PATENT DOCUMENTS

| | | |
|---|---|---|
| DE | 102013102540 A1 | 8/2014 |
| EP | 2284883 A1 | 2/2011 |
| JP | 05167205 A * | 7/1993 |

OTHER PUBLICATIONS

Machine translation of JP-05167205-A (Year: 1993).*

* cited by examiner

*Primary Examiner* — Christopher M Polley
(74) *Attorney, Agent, or Firm* — IPTechLaw LLC

(57) ABSTRACT

Implementations of a substrate may include an electrically insulative layer having a first largest planar side and a second largest planar side opposing the first largest planar side; a first electrically conductive layer coupled to the first largest planar side and including a first scalloped edge having a first pattern; and a second electrically conductive layer coupled to the second largest planar side and including a second scalloped edge having a second pattern. The first pattern and the second pattern may alternate along at least one edge of the first largest planar side and at least one edge of the second largest planar side, respectively.

17 Claims, 4 Drawing Sheets

SUBSTRATES AND RELATED METHODS

BACKGROUND

1. Technical Field

Aspects of this document relate generally to substrates, such as substrates for semiconductor devices.

2. Background

Semiconductor devices are formed using semiconductor substrate materials. Semiconductor devices are packaged using a variety of techniques designed to ensure the semiconductor device is protected from humidity or electrostatic discharge. Various semiconductor packages provide mechanical support for a semiconductor device.

SUMMARY

Implementations of a substrate may include an electrically insulative layer having a first largest planar side and a second largest planar side opposing the first largest planar side; a first electrically conductive layer coupled to the first largest planar side and including a first scalloped edge having a first pattern; and a second electrically conductive layer coupled to the second largest planar side and including a second scalloped edge having a second pattern. The first pattern and the second pattern may alternate along at least one edge of the first largest planar side and at least one edge of the second largest planar side, respectively.

Implementations of a substrate may include one, all, or any of the following:

The first pattern may be periodic.

The second pattern may be periodic.

The first pattern may include repeating angular projections.

The second pattern may include repeating angular projections.

Implementations of a substrate may include an electrically insulative layer having a first largest planar side and a second largest planar side opposing the first largest planar side; a first electrically conductive layer coupled to the first largest planar side and including a first scalloped edge having a first pattern; and a second electrically conductive layer coupled to the second largest planar side and including a second scalloped edge having a second pattern, the second pattern alternating with the first pattern.

Implementations of a substrate may include one, all, or any of the following:

The first pattern may be periodic.

The second pattern may be periodic.

The first pattern may include repeating angular projections.

The second pattern may include repeating angular projections.

Implementations of a method of forming a substrate may include providing an electrically insulative layer having a first largest planar side and a second largest planar side opposing the first largest planar side; coupling a first electrically conductive layer to the first largest planar side; coupling a second electrically conductive layer to the second largest planar side; forming a first scalloped edge having a first pattern in the first electrically conductive layer; and forming a second scalloped edge having a second pattern in the first electrically conductive layer.

Implementations of a method of forming a substrate may include one, all, or any of the following:

Forming the first scalloped edge and forming the second scalloped edge may occur simultaneously.

Forming the first scalloped edge and forming the second scalloped edge may occur separately.

The method may include applying a mask and patterning the mask before forming the first scalloped edge.

The method may include applying a mask and patterning the mask before forming the second scalloped edge.

The first electrically conductive layer and the second electrically conductive layer include copper.

The foregoing and other aspects, features, and advantages will be apparent to those artisans of ordinary skill in the art from the DESCRIPTION and DRAWINGS, and from the CLAIMS.

BRIEF DESCRIPTION OF THE DRAWINGS

Implementations will hereinafter be described in conjunction with the appended drawings, where like designations denote like elements, and.

DESCRIPTION

This disclosure, its aspects and implementations, are not limited to the specific components, assembly procedures or method elements disclosed herein. Many additional components, assembly procedures and/or method elements known in the art consistent with the intended substrates will become apparent for use with particular implementations from this disclosure. Accordingly, for example, although particular implementations are disclosed, such implementations and implementing components may comprise any shape, size, style, type, model, version, measurement, concentration, material, quantity, method element, step, and/or the like as is known in the art for such substrates, and implementing components and methods, consistent with the intended operation and methods.

Various substrates are used in combination with semiconductor devices to provide mechanical, thermal, and/or electrical connection(s) to the semiconductor devices. In various substrate designs, some portion of the substrate may be made of a semiconductor material. In other substrate designs, however, a portion of the substrate may be made of a ceramic material that is electrically insulative and often thermally conducting. For many substrates, the substrate functions to provide electrical connections while allowing for heat transfer from the semiconductor device during operation.

Figure 1:
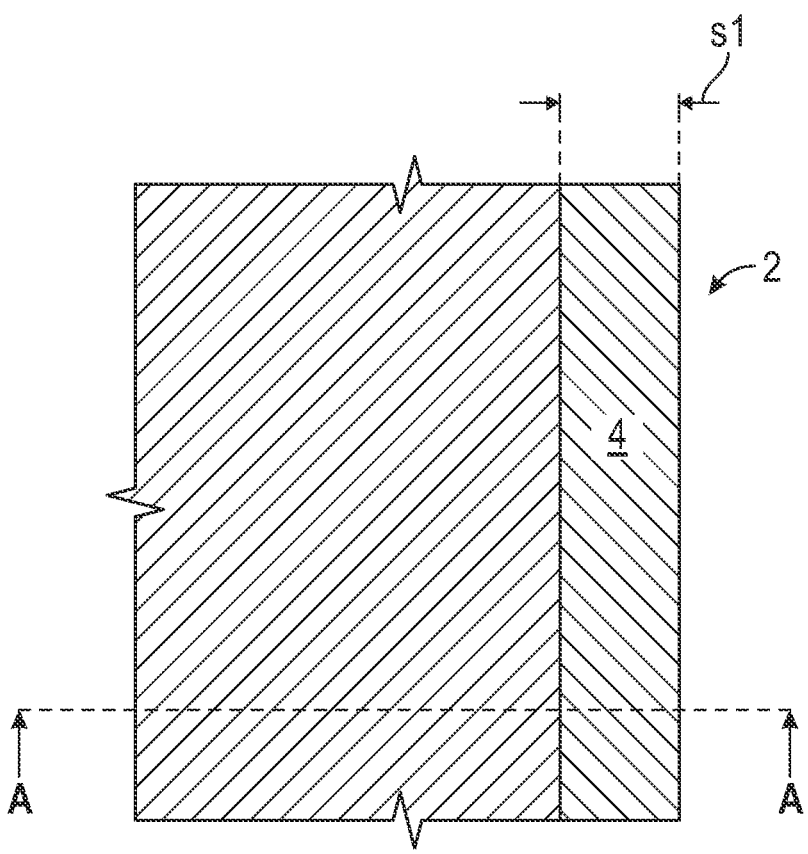
FIG. 1 is a top view of a portion of a direct bond copper substrate showing the sectional line A-A.
Figure 2:
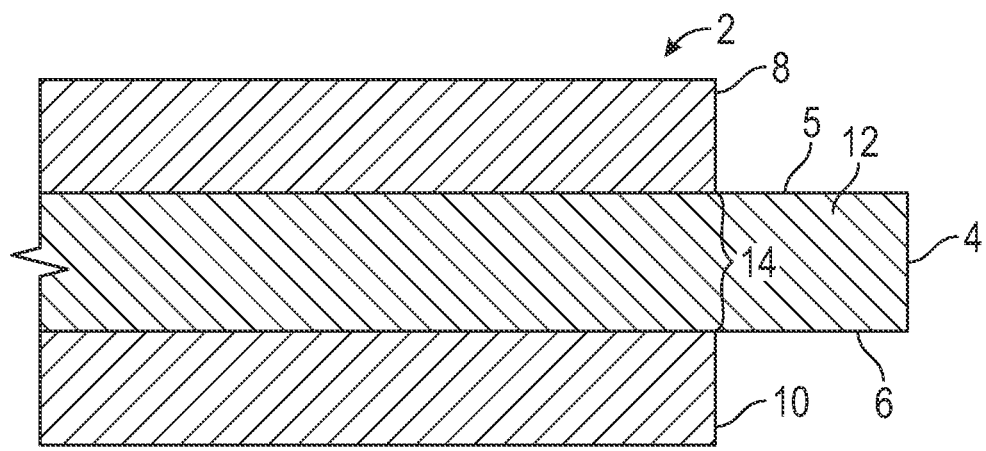
FIG. 2 is a cross sectional view taken along sectional line A-A in FIG. 1.

Direct bond copper (DBC) substrates are a type of substrate used with many semiconductor device types, including power semiconductor devices. As illustrated in FIGS. 1-2, a direct bond copper substrate 2 includes a ceramic electrically insulative layer 4 that has a first largest planar side 5 visible in FIGS. 1 and 2 and a second largest planar side 6 visible in cross section in FIG. 2. A first copper layer 8 is bonded directly to the first largest planar side 5 and a second copper layer 10 is bonded directly to the second largest planar side. The bonding of the copper layers can take place using various methods of high temperature melting and diffusion or sintering where pressure may or may not be applied to the copper layers. The material of the ceramic electrically insulative layer 4 maybe aluminum oxide or aluminum nitride for a direct bond copper substrate.

As illustrated in the top view in FIG. 1 and in the cross sectional view along sectional line A-A in FIG. 2, the material 12 of the ceramic electrically insulative layer 4 extends beyond the outer edges of both the first copper layer 8 and the second copper layer 10. The reason for this is that when the substrate is energized with electricity, the extended material 12 of the ceramic electrically insulative layer 4 serves to increase the electrical isolation between the outer edges of the first copper layer 8 and the second copper layer 10 by increasing the distance an arc of electricity has to travel between the outer edges to establish a short circuit. However, since the ceramic electrically insulative layer 4 is made of a generally mechanically brittle material, any chipping of the extended material 12 reduces the electrical isolation. If the extended material 12 were fully chipped away, the electrical isolation distance is reduced to only the thickness 14 of the electrically insulative layer 4 which may be insufficient to prevent arcing between the first copper layer 8 and the second copper layer 10 during operation under various conditions (voltages, package designs, etc.).

Figure 3:
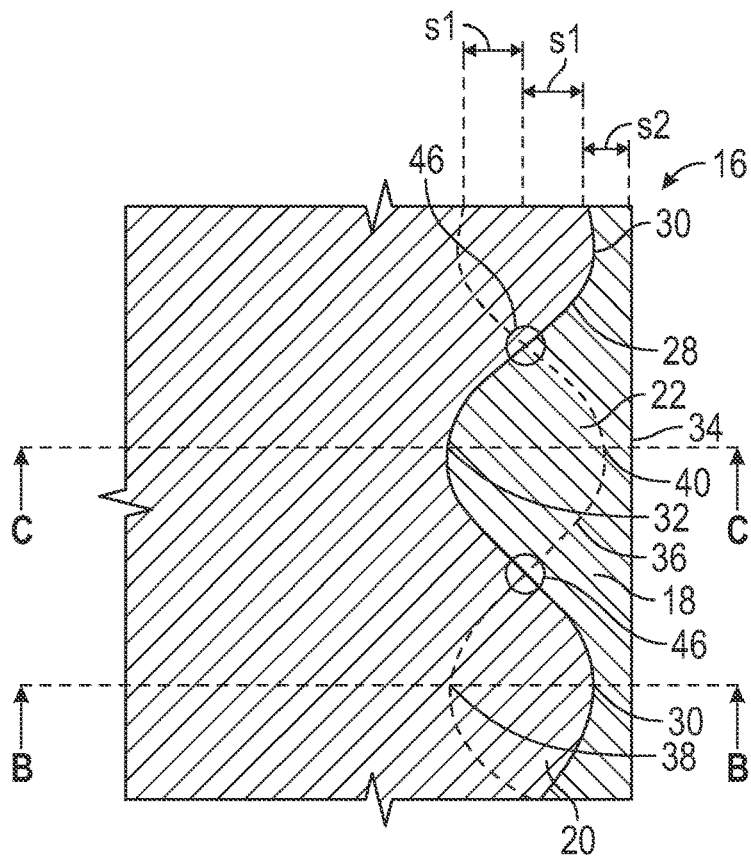
FIG. 3 is a top view of a substrate showing sectional lines B-B and C-C.

The various substrate implementations disclosed herein utilize scalloped edges designed to increase the electrical isolation between electrically conductive layers on each side of an electrically insulative layer. As used herein, "scalloped" refers to a pattern including a series of circular/elliptical segments and/or angular projections formed in a border/edge of a layer. Referring to FIG. 3, a substrate 16 with an electrically insulative layer 18 is illustrated with a first electrically conductive layer 20 and a second electrically conductive layer 22 coupled thereto. The second electrically conductive layer 22 is shown in partial see-through and is coupled to a second largest planar surface 24 of the electrically insulative layer 18 while the first electrically conductive layer 20 is coupled to a first largest planar surface 26 (referring to FIG. 4). As illustrated in FIG. 3, the scalloped edge 28 of the first electrically conductive layer 20 is formed of a periodic pattern that meanders from side to side (like, by non-limiting example, a sinusoidal pattern) formed of circular/elliptical segments that cause the scalloped edge 28 to alternate between a first point 30 closest to the outer edge 34 of the electrically insulative layer 18 and a second point 32 farthest away from the outer edge 34 (a total amplitude of s1+s1). The second electrically conductive layer 22 also includes a scalloped edge 36 that includes a substantially similar periodic pattern also formed of circular/elliptical segments that cause the edge 36 to alternate between a first point 38 and a second point 40, the first point 38 being farthest away from the outer edge 34 and the second point 40 being closest to the outer edge 34 of the electrically insulative layer 18 (s2 being the distance between the second point 40 and the outer edge 34). By inspection, the periodic pattern of the first electrically conductive layer 20 is about 180 degrees out of phase from the periodic pattern of the second electrically conductive layer 22, causing them to regularly intersect, but ensuring that the first points 30, 38 and second points 32, 40 are always as far apart from each other as possible when viewed top down.

Figure 4:
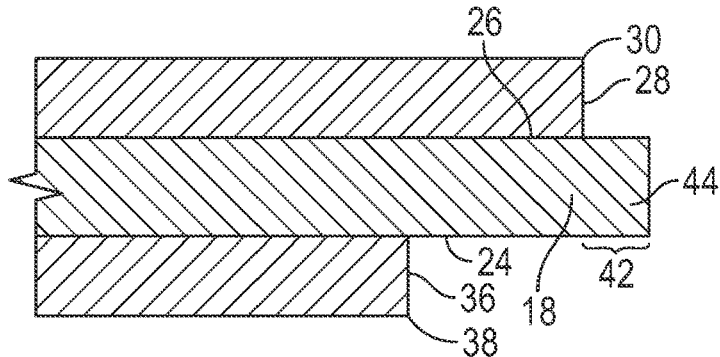
FIG. 4 is a cross sectional view taken along sectional line B-B of FIG. 3.
Figure 5:
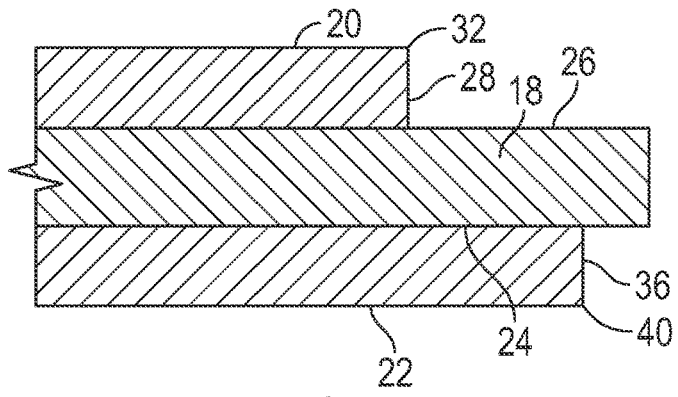
FIG. 5 is a cross sectional view taken along sectional line C-C of FIG. 3.
Figure 8:
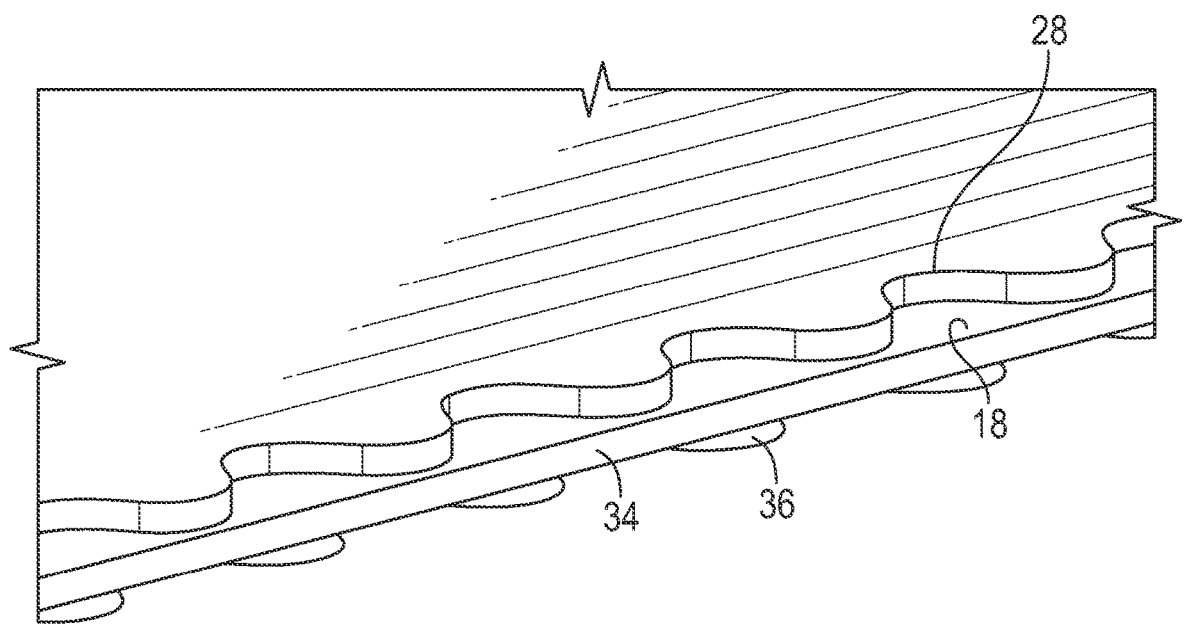
FIG. 8 is a perspective view of an implementation of a substrate with electrically conductive layers having scalloped edges formed of a periodic pattern.
Figure 9:
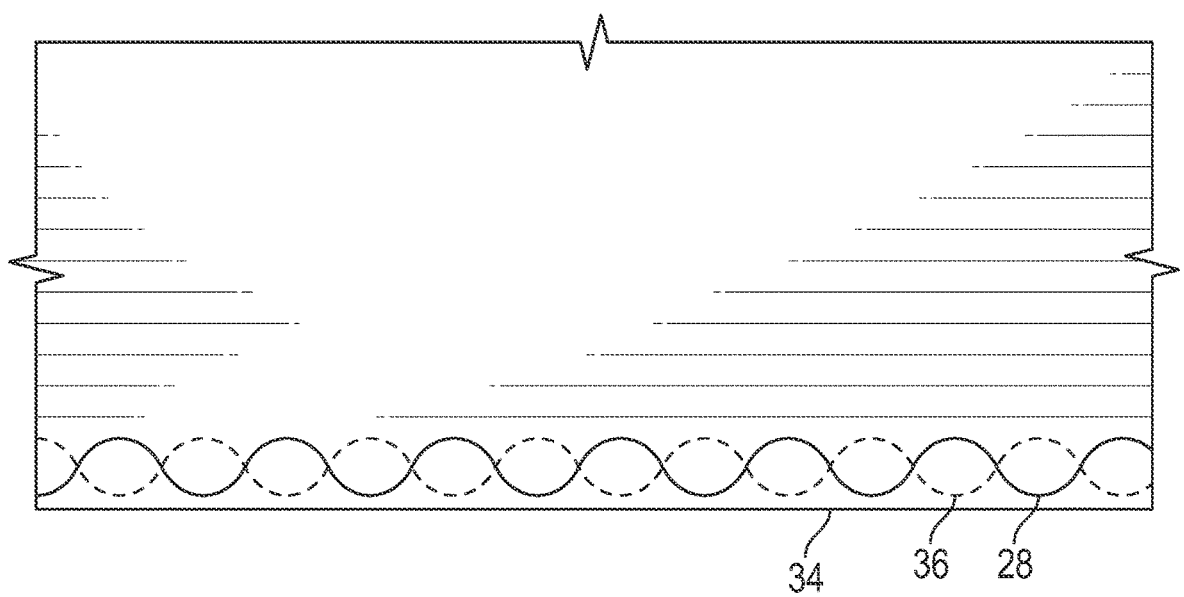
FIG. 9 is a top partial see-through view of an implementation of a substrate with electrically conductive layers having scalloped edges formed of a periodic pattern.

FIGS. 4 and 5 show a detail of the cross section of the substrate 16 taken at sectional lines B-B and C-C, respectively. In FIG. 4, the scalloped edge 28 is shown at the first point 30 of the first electrically conductive layer 20 and at the second point 38 of the scalloped edge 36 of the second electrically conductive layer 22, respectively. As is evident by inspection, the distance between the scalloped edges 28, 36 is maximized in this view. FIG. 5 illustrates the scalloped edge 28 of the first electrically conductive layer 20 at its second point 32 and the scalloped edge 36 of the second electrically conductive layer 22 at its second point 40. The distance between the scalloped edges 28, 36 is also maximized in this view. FIG. 8 illustrates a perspective view of the scalloped edge 28 and scalloped edge 36 relative to the edge 34 of the electrically insulative layer 18. FIG. 9 is a longer partial see-through view of the scalloped edges 28 and 36 along with the edge 34 of the electrically insulative layer 18.

As illustrated in FIG. 4, if the entire length 42 of the extended portion 44 of the electrically insulative layer 18 were broken off, the remaining separation between the scalloped edges 28, 36 is substantially more than just the thickness of the electrically insulative layer 18 itself as would be the case for the substrate illustrated in FIG. 2. Accordingly, the substrate 16 illustrated in FIGS. 3-5 has more robust electrical isolation than the substrate 2 illustrated in FIGS. 1-2. Even at the set of closest points 46 where the scalloped edges 28, 36 intersect, where theoretically the first and second electrically conductive layers 20, 22 are separated only by the thickness of the electrically insulative layer 18, the likelihood that chipping could occur all the way down to this point is reduced. This is because the material of the first electrically conductive layer 20 and the material of the second electrically conductive layer 22 works to mechanically support and prevent chipping and/or chip spreading into/reaching this location leaving no residual electrically insulative material.

Also, as illustrated in FIGS. 8 and 9, the frequency of which the maxima and minima of the scalloped edges 28, 36 can be set to a value that results in minimizing the number of closest points to reduce the chipping risk. In other implementations, however, the frequency of the maxima and minima of the scalloped edges 28, 36 may be maximized to create many closely spaced closest points as a way of making it difficult for any chip to propagate sufficiently into the material of the electrically insulative layer 18 to reach any particular closest point. Because of ability of the scalloped edges to create a finite (rather than infinite) number of closest points at which a chip could cause isolation failure, the odds that any given chip could result in electrical isolation failure with the scalloped edge design of the substrate 16 of FIGS. 3-5 is significantly reduced compared to the substrate 2 illustrated in FIGS. 1-2.

Figure 6:
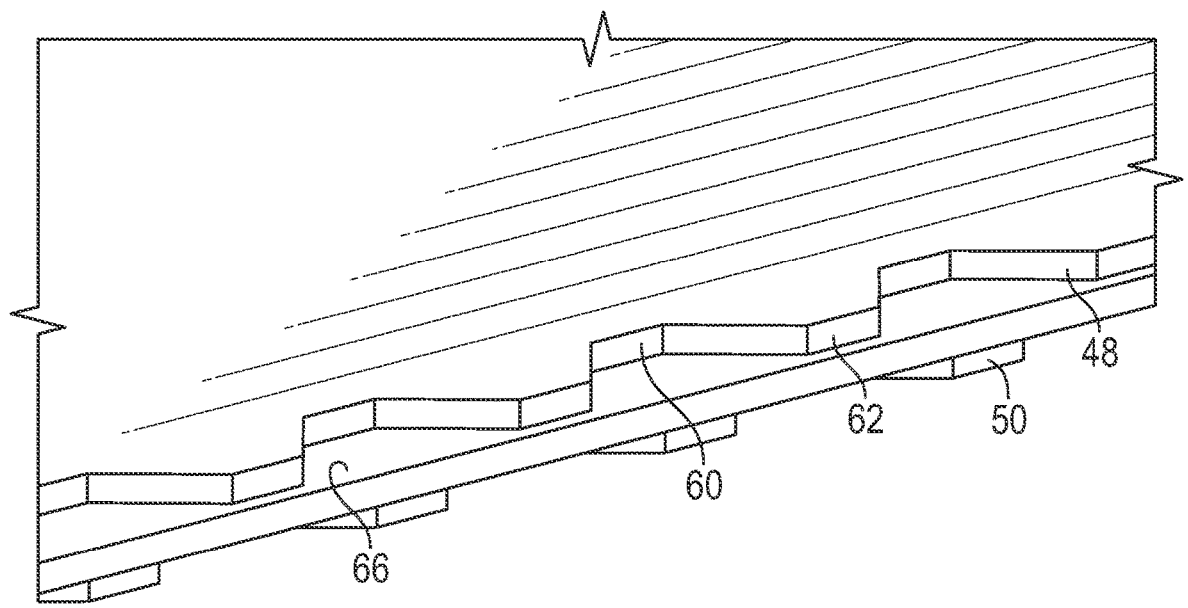
FIG. 6 is a perspective view of an implementation of a substrate with electrically conductive layers having scalloped edges formed of repeating angular projections.
Figure 7:
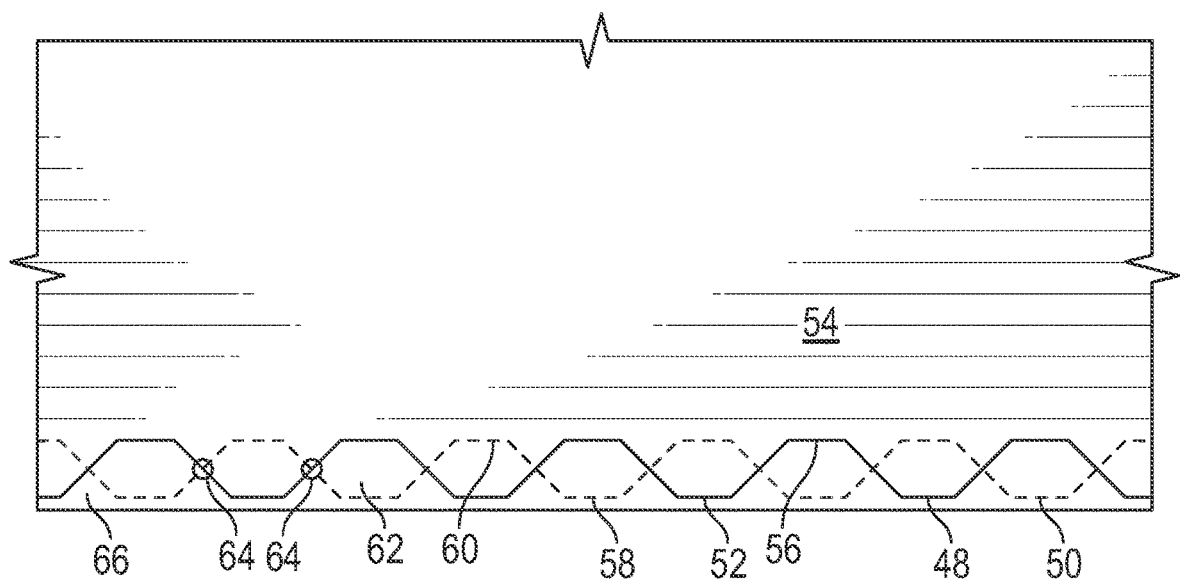
FIG. 7 is a top partial see-through view of an implementation of a substrate with electrically conductive layers having scalloped edges formed of repeating angular projections.

A wide variety of repeating shapes may be employed in various implementations of scalloped edges. Referring to FIGS. 6 and 7, a first scalloped edge 48 and second scalloped edge 50 are illustrated where each is formed of a set of repeating angular projections. As illustrated, the first set of angular projections of the first scalloped edge 48 are formed of a set of first angled lines that connect an outer edge 52 and an inner edge 56 of the first electrically conductive layer 54. Similarly, the second set of angular projections of the second scalloped edge 50 are formed of a corresponding alternating/intersecting set of second angled lines the connect the outer edge 58 with the inner edge 60 of the second electrically conductive layer 62. As with the periodic pattern of the implementation of FIGS. 3-5 and 8-9, there exists a set of closest points 64 where the first set of angled lines and the second set of angled lines intersect. The number of angular projections in each of the first scalloped edge 48 and the second scalloped edge 50 is determined by the angles at which the first set of angled lines and the second set of angled lines meet the outer edges 52, 58 and inner edges 56, 60 respectively. Where the angles are less obtuse (closer to 90 degrees), more angular projections will be included in the first and second scalloped edges 48, 50; where the angles become more obtuse (further from 90 degrees), fewer angular projections will included in the first and second scalloped edges. The number of angular projections can be tuned and provide similar electrical isolation-enhancing effects in response to chipping of the electrically insulative layer 66 by changing the angles of the first and second sets of angled lines.

The shape of each of the angular projections in the implementation illustrated in FIGS. 6-7 is that of an isosceles trapezoid. However, many other shapes are possible in various implementation, depending on the particular spacing used between the sets of angled lines. Where the spacing becomes basically zero, meaning that all of the angled lines intersect, the shape of each of the angular projections becomes a triangle. Where the angles become close to 90 degrees, the shape of the angle projections approaches a rectangular shape (though still remaining trapezoidal). In other implementations, however, instead of the use of angled lines, the use of arcs between the outer edges 52, 58 and inner edges 56, 60 may be employed, forming a shape that has a straight outer edge but curved side edges. In various implementations, the arcs may be all convex, all concave, or a mixture of convex and concave. Where the spacing between the arcs becomes basically zero, the shape of the angular projections may take on the shape of a curved edged points or be circular or oval (depending on whether concave or convex lines are being used).

In other implementations, however, various combinations of straight lines and arcs may be employed, where instead of a single angled line extending between the outer edges 52, 58 and inner edges 56, 60, multiple angled lines, multiple arcs, or any combination of angled line(s) and arc(s) may be used to form more complex angular projections. Furthermore, instead of angled lines in various implementations, the edges of the angular projections may be formed as a set of two or more steps formed into the edges/sides of each angular projection to form a fully stepped version of the shape of FIG. 7 that does not have any angled lines, but still forms an alternating stair-stepped pattern on each side of the electrically insulative layer.

While the use of alternating patterns for the scalloped edges where the pattern of the first electrically conductive layer is the same or substantially the same as the pattern of the second electrically conductive layer, in other implementations, different patterns for each scalloped edge may be employed. For example, a periodic pattern could be used for the first electrically conductive layer and a pattern with repeating angular projections could be used for the second electrically conductive layer. In such implementations, the particular pattern type chosen for each layer may be determined by the desired number/position of the resulting closest points. In other implementations, the pattern type for each scalloped edge may be determined by the degree of chip resiliency (isolation risk tolerance) desired for the surface of the electrically insulative layer next to either electrically conductive layer. For example, if semiconductor die are attached to the first electrically conductive layer and the second electrically conductive layer will be bonded to a heat sink, meaning the side of the electrically insulative layer coupled to the second electrically conductive layer is less likely to be contacted during processing or during use of the resulting package, a pattern with fewer projections/circular/curved sections may be used on the scalloped edge for the second electrically conductive layer while a pattern with more projections may be used for the scalloped edge for the first electrically conductive layer (or vice versa). While the use of symmetrical patterns for the scalloped edges prevents any warpage effect caused by unequal amounts of electrically conductive material on each side of the electrically insulative layer, the use of non-symmetrical patterns may not be significant enough to appreciably impact warpage, depending on the type of shapes employed and whether the total areas of electrically conductive material on each side remains sufficiently equal.

In some implementations, the cross sectional shape of the edge of the first and/or second electrically conductive layers may not be substantially straight or 90 degrees as represented in FIGS. 4 and 5 but may be otherwise angled or curved. This ability to alter the cross sectional shape of the edge of one or both of the electrically conductive layers may allow for adjustment of warpage, stress, and/or increased resilience against or to chipping of the electrically insulative layer.

In various substrate implementations, the material for the first electrically conductive layer and the second electrically conductive layer may be formed of a metal or metal alloy. In some implementations, the material for both electrically conductive layers may be the same; in others, however, different materials/alloys may be employed. By non-limiting example, the material for the electrically conductive layers may be copper, aluminum, a copper alloy, an aluminum alloy, or another electrically conductive meta. By non-limiting example, the material for the electrically insulative layer may be, by non-limiting example, alumina, aluminum oxide, aluminum nitride, multiple layers of the same or different electrically insulative layers, any combination thereof, or any other electrically insulative material capable of being coupled to the electrically conductive layers. Furthermore, any of a wide variety of semiconductor die may be employed with the various substrate implementations disclosed herein, including, by non-limiting example, power semiconductor die, silicon carbide die, metal oxide field effect transistors (MOSFETs), diodes, insulated-gate bipolar transistors (IGBITs), or any other semiconductor device type.

The various substrate implementations disclosed herein may be manufactured using various implementations of a method of forming a substrate. The method includes providing an electrically insulative layer that has a first largest planar side and a second largest planar side that opposes the first largest planar side, with a thickness between them. The electrically insulative material may be any disclosed in this document. The method also includes coupling a first electrically conductive layer to the first largest planar side and coupling a second electrically conductive layer to the second largest planar side. In various method implementations, the coupling may be accomplished through, by non-limiting example, sintering, brazing, active metal brazing, thermo-compression bonding, ultrasonic bonding, heating, gluing, welding, or any other technique for securing the material(s) of the electrically conductive layers to the material(s) of the electrically insulative layer. In various method implementations, a first scalloped edge is formed in the first electrically conductive layer. A second scalloped edge is formed in the second electrically conductive layer. A pattern of the first scalloped edge alternates with a pattern of the second scalloped edge.

In various method implementations, the formation of the first scalloped edge and the second scalloped edge may occur simultaneously. In other method implementations, the first scalloped edge and the second scalloped edge may be formed separately. In various method implementations, the pattern of each scalloped edge may be formed by applying a mask and patterning the mask prior to etching the pattern into the material of either the first electrically conductive layer or the second electrically conductive layer. Where the use of patterned masks is used, applying the mask and patterning the mask may occur prior to forming the first scalloped edge (and prior to forming the second scalloped edge in some implementations). In other implementations, applying the mask and patterning the mask may occur prior to forming the second scalloped edge (and prior to forming the first scalloped edge in some implementations). Depending on the material of the electrically conductive layer, the process of etching the material of the electrically conductive layers may include, by non-limiting example, wet etching, dry etching, any combination thereof, or any other etching/patterning process capable of removing the material of the electrically conductive layers.

In places where the description above refers to particular implementations of substrates and implementing components, sub-components, methods and sub-methods, it should be readily apparent that a number of modifications may be made without departing from the spirit thereof and that these implementations, implementing components, sub-components, methods and sub-methods may be applied to other substrates.

What is claimed is:

1. A substrate comprising:
   an electrically insulative layer having a first largest planar side and a second largest planar side opposing the first largest planar side;
   a first electrically conductive layer coupled to the first largest planar side and comprising a first scalloped edge having a first pattern; and
   a second electrically conductive layer coupled to the second largest planar side and comprising a second scalloped edge having a second pattern;
   wherein the first pattern and the second pattern alternate along at least one edge of the first largest planar side and at least one edge of the second largest planar side, respectively.

2. The substrate of claim 1, wherein the first pattern is periodic.

3. The substrate of claim 1, wherein the second pattern is periodic.

4. The substrate of claim 1, wherein the first pattern comprises repeating angular projections.

5. The substrate of claim 1, wherein the second pattern comprises repeating angular projections.

6. The substrate of claim 2, wherein the second pattern is periodic.

7. The substrate of claim 4, wherein the second pattern comprises repeating angular projections.

8. A substrate comprising:
   an electrically insulative layer having a first largest planar side and a second largest planar side opposing the first largest planar side;
   a first electrically conductive layer coupled to the first largest planar side and comprising a first scalloped edge having a first pattern; and
   a second electrically conductive layer coupled to the second largest planar side and comprising a second scalloped edge having a second pattern, the second pattern alternating with the first pattern.

9. The substrate of claim 8, wherein the first pattern is periodic.

10. The substrate of claim 8, wherein the second pattern is periodic.

11. The substrate of claim 8, wherein the first pattern comprises repeating angular projections.

12. The substrate of claim 8, wherein the second pattern comprises repeating angular projections.

13. The substrate of claim 9, wherein the second pattern is periodic.

14. The substrate of claim 11, wherein the second pattern comprises repeating angular projections.

15. A substrate comprising:
    an electrically insulative layer having a first largest planar side and a second largest planar side opposing the first largest planar side;
    a first electrically conductive layer coupled to the first largest planar side and comprising a first scalloped edge having a first sinusoidal pattern; and
    a second electrically conductive layer coupled to the second largest planar side and comprising a second scalloped edge having a second sinusoidal pattern;
    wherein the first sinusoidal pattern and the second sinusoidal pattern alternate along at least one edge of the first largest planar side and at least one edge of the second largest planar side, respectively.

16. The substrate of claim 15, wherein the first sinusoidal pattern is 180 degrees out of phase with the second sinusoidal pattern.

17. The substrate of claim 15, wherein the first scalloped edge overlaps the second scalloped edge only at recessed locations of the first scalloped edge and recessed locations of the second scalloped edge.

* * * * *